(12) United States Patent
Chiang (10) Patent No.: US 10,509,697 B2
(45) Date of Patent: Dec. 17, 2019

(54) DATA STORAGE DEVICE AND OPERATING METHOD THEREFOR

(71) Applicant: Silicon Motion, Inc., Jhubei (TW)

(72) Inventor: Tsung-Yao Chiang, New Taipei (TW)

(73) Assignee: Silicon Motion, Inc., Jhubei (TW)

( * ) Notice: Subject to any disclaimer, the term of this patent is extended or adjusted under 35 U.S.C. 154(b) by 45 days.

(21) Appl. No.: 15/968,305

(22) Filed: May 1, 2018

(65) Prior Publication Data

US 2019/0065309 A1 Feb. 28, 2019

(30) Foreign Application Priority Data

Aug. 30, 2017 (TW) .............................. 106129515 A (51) Int. Cl.
*G11C 29/00* (2006.01)
*G06F 11/10* (2006.01)
*G11C 29/52* (2006.01)

(52) U.S. Cl.
CPC ...... *G06F 11/1068* (2013.01); *G06F 11/1004* (2013.01); *G11C 29/52* (2013.01)

(58) Field of Classification Search
CPC .......................... G06F 11/1068; G06F 11/1004
See application file for complete search history.

(56) References Cited

U.S. PATENT DOCUMENTS

| | | | |
|---|---|---|---|
| 8,914,670 B2 | 12/2014 | Zaltsman et al. | |
| 2010/0332952 A1* | 12/2010 | Chung | G06F 11/1068 |
| | | | 714/773 |
| 2012/0047409 A1 | 2/2012 | Post et al. | |
| 2012/0254694 A1* | 10/2012 | Golov | G06F 11/1044 |
| | | | 714/763 |
| 2014/0310574 A1 | 10/2014 | Yu et al. | |
| 2015/0178149 A1* | 6/2015 | Cai | G06F 11/108 |
| | | | 714/766 |
| 2016/0103734 A1* | 4/2016 | Chen | G11C 29/52 |
| | | | 714/764 |
| 2016/0246807 A1 | 8/2016 | Yu et al. | |

FOREIGN PATENT DOCUMENTS

CN 105573681 B 3/2017

OTHER PUBLICATIONS

Office Action of corresponding TW application, dated Aug. 23, 2018.

* cited by examiner

*Primary Examiner* — Samir W Rizk (74) *Attorney, Agent, or Firm* — Wang Law Firm, Inc.

(57) ABSTRACT

A data storage device includes a flash memory, a controller and a random-access memory. The flash memory includes a plurality of blocks, and each of the blocks includes a plurality of pages. The controller divides the pages of the blocks into a plurality of super pages which include a plurality of first pages and a plurality of second pages. The controller writes at least one super page data to one of the first pages, generates a parity code based on the at least one super page data, and stores the parity code on the random-access memory.

22 Claims, 7 Drawing Sheets

| Writing Sequence | Page# |
|---|---|
| 0 | P#0 |
| 1 | P#3 |
| 2 | P#6 |
| 3 | P#9 |
| 4 | P#12 |
| 5 | P#15 |
| 6 | P#18 |
| 7 | P#21 |
| 8 | P#24 |
| 9 | P#27 |
| 10 | P#1～P#2 |
| 11 | P#30 |
| 12 | P#4～P#5 |
| 13 | P#33 |
| 14 | P#7～P#8 |
| 15 | P#36 |
| 16 | P#10～P#11 |
| 17 | P#39 |
| 18 | P#13～P#14 |
| 19 | P#42 |
| 20 | P#16～P#17 |
| 21 | P#45 |
| 22 | P#19～P#20 |
| 23 | P#48 |
| 24 | P#22～P#23 |
| 25 | P#51 |
| 26 | P#25～P#26 |
| 27 | P#54 |
| ... | ... |

DATA STORAGE DEVICE AND OPERATING METHOD THEREFOR

CROSS REFERENCE TO RELATED APPLICATIONS

This Application claims priority of Taiwan Patent Application No. 106129515 filed on Aug. 30, 2017, the entirety of which is incorporated by reference herein.

BACKGROUND OF THE INVENTION

Field of the Invention

The disclosure generally relates to a data storage device and a data storage method, and more particularly, to a data storage device and a data storage method which utilize parity code to repair data in order to save storage space.

Description of the Related Art

There are various forms of nonvolatile memory used in data storage devices for long-term data retention, such as flash memory, magneto-resistive RAM, ferroelectric RAM, resistive RAM, spin transfer torque-RAM (STT-RAM), and so on.

How to improve the operational efficiency of a data storage device is an important issue in this area of technology.

BRIEF SUMMARY OF THE INVENTION

The present invention provides a data storage device to store the parity code for repairing data instead of storing the data of the page. Because the parity code requires less storage space, the storage space of the data storage device can be effectively reduced to improve the efficiency of accessing data. In addition, the number of parity codes stored by the data storage device is fixed. Even if the amount of data that is written to the data storage device increases, the storage space required for storing the parity code will not increase. Furthermore, the indicator or the counting value is utilized by the present invention to perform dynamic management of the parity code to improve the performance of data management.

The present invention provides a data storage device comprising a random access memory (RAM), a flash memory, and a controller. The flash memory includes a plurality of blocks, wherein each of the blocks comprises a plurality of pages. The controller arranges the pages of the blocks into a plurality of super pages. The super pages are divided into a plurality of first pages and a plurality of second pages. The controller writes at least one super page data to one of the first pages, generates a parity code based on the super page data, and stores the parity code at the RAM.

The present invention provides a data storage device which is coupled to a host. The data storage device includes a random access memory (RAM) and a flash memory. The flash memory includes a plurality of blocks. Each of the blocks comprises a plurality of pages, and the host arranges the pages of the blocks into a plurality of super pages. The super pages are divided into a plurality of first pages and a plurality of second pages. The host outputs at least one super page data to the data storage device, generates a parity code based on the super page data, and stores the parity code at the RAM.

The present invention provides a data storage method applied to a data storage device which comprises a flash memory and a controller. The flash memory comprises a plurality of blocks. Each of the blocks comprises a plurality of pages. The data storage method comprises: arranging the pages of the blocks to be a plurality of super pages, wherein the super pages are divided into a plurality of first pages and a plurality of second pages; writing at least one super page data to one of the first pages; generating a parity code based on the super page data; and storing the parity code in the RAM.

The present invention provides a data storage method for controlling data storage for a data storage device. The data storage device comprises a flash memory, the flash memory comprises a plurality of blocks, and each of the blocks comprises a plurality of pages. The data storage method comprises: arranging the pages of the blocks to be a plurality of super pages, wherein the super pages are divided into a plurality of first pages and a plurality of second pages; outputting at least one super page data to one of the first pages; generating a parity code based on the super page data; and storing the parity code in the RAM.

Other aspects and features of the present invention will become apparent to those with ordinarily skill in the art upon review of the following descriptions of specific embodiments of the data storage device and the data storage method.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
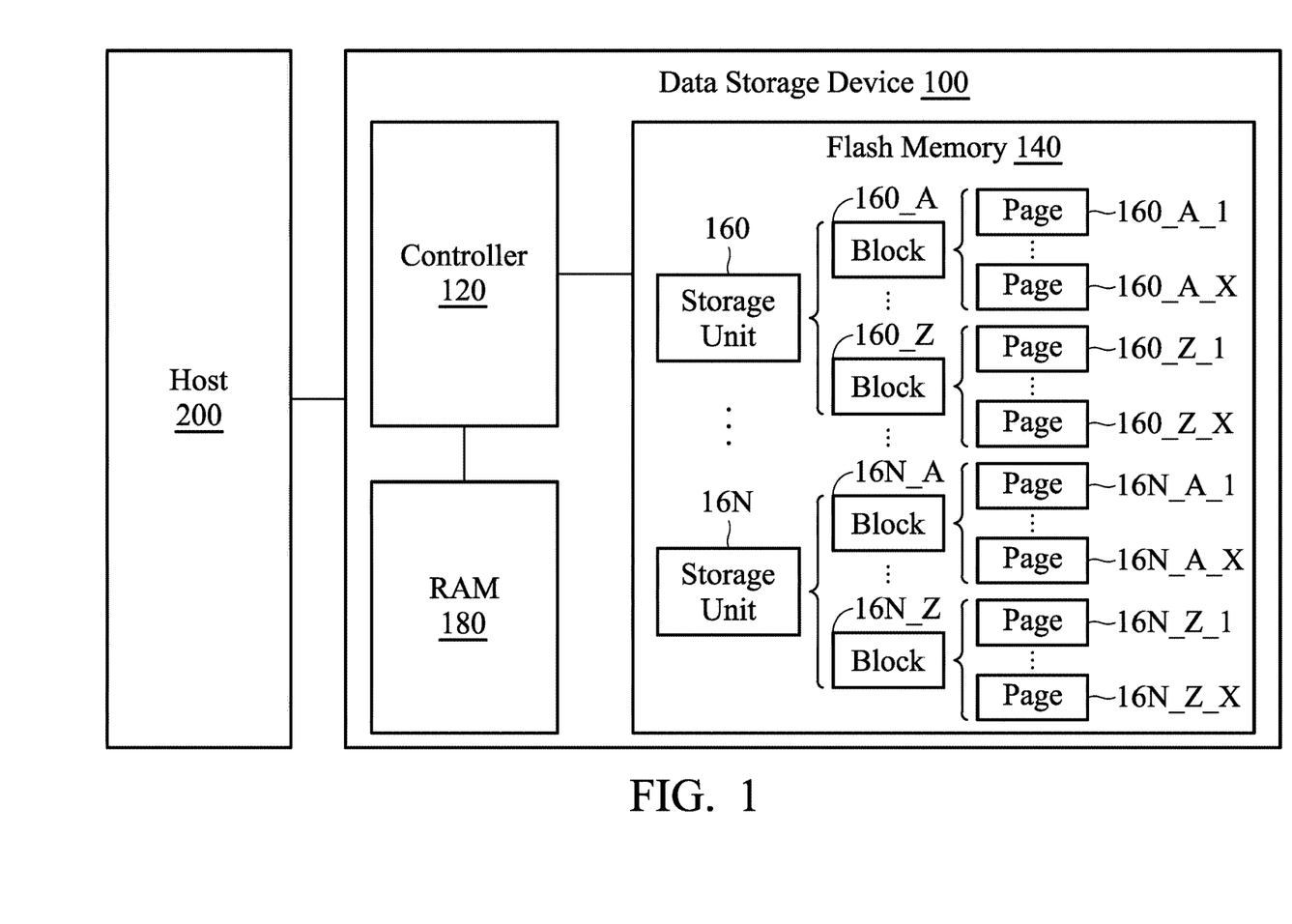
FIG. 1 is a block diagram illustrating the data storage device according to an embodiment of the invention.

FIG. 1 is a schematic illustrating the data storage device 100 and the host 200 according to an embodiment of the invention. In one embodiment, the data storage device 100 includes a controller 120, a non-volatile memory and a random access memory (RAM) 180. The data storage device 100 is coupled to the host for transmitting data and commands, or receiving data and commands. The communication protocol between the data storage device 100 and the host 200 complies with the eMMC standard, the UFS standard, the SD standard, the SATA standard, or the NVMe standard. The non-volatile memory could be NAND flash, magneto-resistive RAM, ferroelectric RAM, resistive RAM (RRAM), spin transfer torque RAM (STT-RAM), and so on, in order to store data for a long time. The flash memory 140 will be used as an example for illustration in the following description, but it is not limited.

As shown in FIG. 1, the controller 120 is coupled to the flash memory 140 and the RAM 180. The RAM 180 is utilized to temporarily store and cache the data which is needed by the controller 120, or temporarily store the data which will be written to the flash memory 140 by the host 200 in order to facilitate timely access to the data storage device 100. The RAM 180 is preferably SRAM, or it could be DRAM.

The controller 120 is coupled to the flash memory 140 to transmit data and instructions or to receive data and instructions mutually. In one embodiment, there are four channels (CH0~CH3) between the controller 120 and the flash memory 140 to transmit data or commands. Furthermore, the controller 120 can be a read-only-memory (ROM) and a micro-controller with firmware code, and the micro-controller executes the firmware code to operate or access the flash memory 140.

The flash memory 140 includes a storage matrix which is composed of a plurality of storage units 160~16N. In one embodiment, each storage unit includes at least one die, and each die includes at least one plane. Each plane includes several blocks 160_A~16N_Z, and each block includes several pages. In one embodiment, each block of each plane is combined to be a super block so that the flash memory 140 includes several super blocks and each super block includes several super pages. Because the page and the super page have similar operational features, they will be illustrated alternatively in the following specification for simplicity, but are not limited.

As shown in FIG. 1, the storage unit 160 includes several blocks 160_A~160_Z. The storage unit 16N includes several blocks 16N_A~16N_Z. For example, Z is 2048. Regarding the storage unit 160, each of the blocks 160_A~160_Z further includes several pages 160_A_1~16N_Z_X. For example, X is 768, the data storage capacity of each page 160_A_1~16N_Z_X is 16 KB, and the page capacity of a page is four time the data of 4 KB. When the writing operation is performed for the flash memory 140 by the controller 120, the data is written with the minimum data writing unit of a page. The page is controlled by the word line.

Regarding the flash memory 140, each page 160_A_1~16N_Z_X of the blocks 160_A~16N_Z has different physical address. When a data writing operation is performed by the data storage device 100, the controller 120 determines a physical address of the flash memory 140 to write data. In addition, the controller 120 maps the above physical addresses to the logical addresses of data respectively, and develops a mapping table H2F. Therefore, regarding the host 200, the host 200 reads data from the data storage device 100 through the logical address. The controller 120 obtains the physical address by utilizing the mapping table H2F and provides the data stored by the physical address to the host 200. The mapping table H2F may be developed and maintained by the controller 120, or it may be developed and maintained by the host 200.

Figure 2:
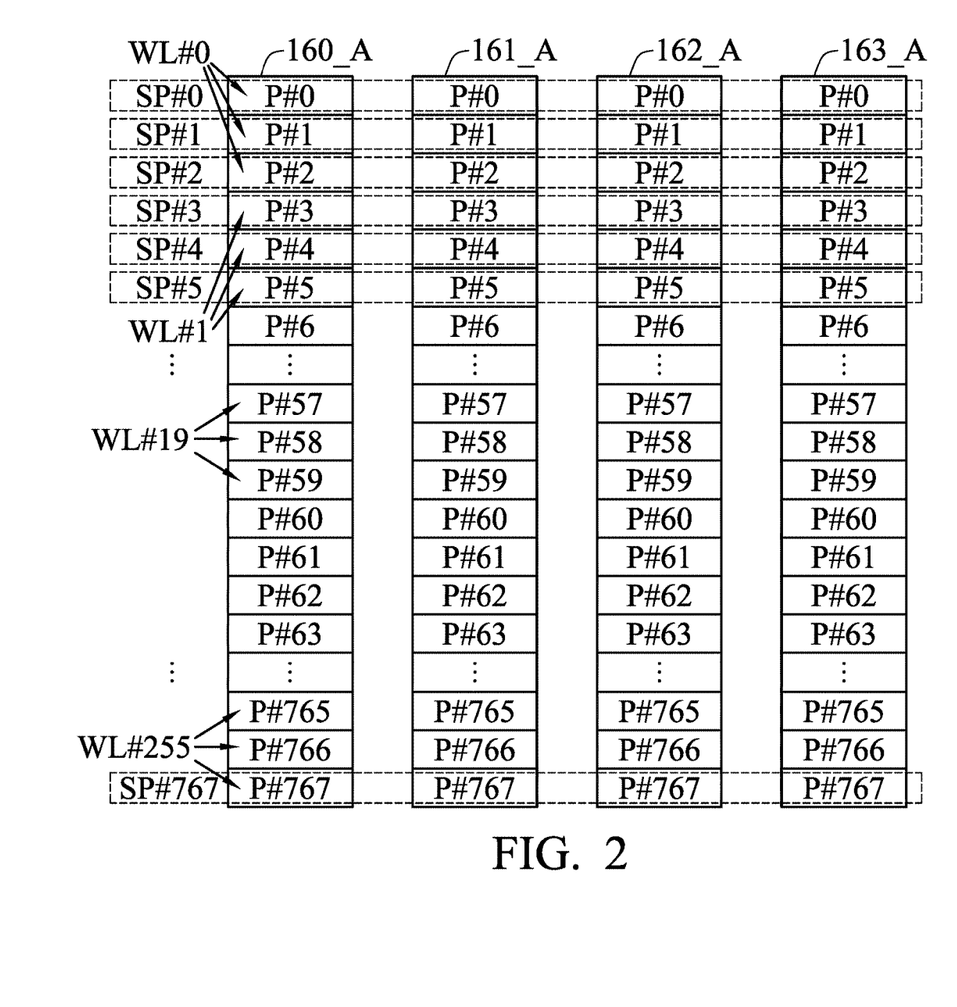
FIG. 2 is a schematic illustrating the spare block according to an embodiment of the invention.

FIG. 2 is a schematic illustrating the spare block according to an embodiment of the invention. As shown in FIG. 2, the flash memory 140 includes four storage units 160~163 which include the blocks 160_A~163_A respectively. The super block is constituted by the blocks 160_A~163_A by the controller 120. Each of the blocks 160_A~163_A includes 768 pages respectively which are the pages P#0~P#767. The controller 120 arranges the pages of same numeral number in the blocks 160_A~163_A into a superblock, such as super blocks SP#0~SP#767 which store the super page data of 64 KB respectively. The storage units 160~163 are preferably arranged on different channels or they could be arranged on two channels uniformly.

Because some pages of the blocks 160_A~163_A could not function normally, the controller 120 could arrange pages of different numbers and identical write sequence in the blocks 160_A~163_A to become the super page. In addition, some pages could be shaded because they cannot function normally. Therefore, the total number of super pages might be smaller than 767.

The flash memory 140 could be the triple-level cell (TLC) structure, and the pages P#0~P#2 could be controlled by the word line WL#0. In other words, the operation of three pages could be controller by a word line. The page P#0 is called the lower page. The pages P#1~P#2 are called the upper pages. In addition, the flash memory 140 could be the quadruple-level cell (QLC) structure, and the pages P#0~P#3 could be controlled by the same word line. In other words, the operation of four pages could be controller by a word line. The pages P#0~P#1 are called the lower pages, and the pages P#2~P#3 are called the upper pages. In other embodiment, the page P#0 is called the lower page, and the pages P#1~P#3 are called the upper pages. The TLC will be taken as examples for illustration in the following description.

Regarding the pages controller by the same word line, it is preferable for the controller 120 to write the page data into the flash memory 140 by a two-pass writing method. In other words, the page data is written into the lower page at the first stage, and it is written into the upper page at the second stage. In another embodiment, the page data is written into the lower page at the first stage. Afterwards, the page date of the lower page is referred to in the second stage, and the page data is written into the upper page. Because the number of the page date included in the lower page and the upper page is greater than one, writing the page data into the upper page or the lower page means that one or more than one page data is written into the lower page or the upper page.

Based on the operating features of the flash memory 140, there is no relationship between the sequence of writing data and the number sequence of the pages. It is determined according to the write searching table or the determination formula. In the example of the write searching table of FIG. 3, after the page data is written into the pages P#0, P#3, P#6, P#9, P#12, P#15, P#18, P#21, P#24 and P#27 (lower page), two page data are written into pages P#1~P#2 (upper page). Afterwards, the page data are written into the lower page and the upper page alternatively, and so on. If it is a super page, after the super page data is written into the pages SP#0, SP#3, SP#6, SP#9, SP#12, SP#15, SP#18, SP#21, SP#24 and SP#27 (lower page), two super page data are written into pages SP#1~SP#2 (upper page). Afterwards, the super page data are written into the lower page and the upper page alternatively, and so on.

If the super page data fails to be written into the upper page, the super page data stored in the lower page will be lost or damaged. In order to ensure the accuracy and reliability of data storage, the super page data stored on the power page will be backup to the RAM 180 by the controller 120 for data backup or recovering, and it will not be deleted until the writing operation of the lower page and the upper page is completed. However, when the writing gap between the lower page and the upper page becomes larger, which means that the number of writing operations on the lower page is greater between the writing operations of the lower page and the upper page controller by the same word line, the controller 120 is required to store more super page data to the RAM 180. In the embodiment of the write searching table of FIG. 3, the writing difference (the maximum value) is 10, and 10 super page data of the power page need to be stored in the RAM 180 by the controller 120. Many data storage spaces of the RAM 180 are occupied by the super page data. In addition, regarding one or more currently-written super pages, the super page will be stored to the RAM 180 before the writing operation is confirmed to be completed.

In order to solve the above problems, the exclusive OR gate (XOR gate) is embedded within the controller 120 by the present invention. Several pages or a super page could a parity unit, the parity code (PC) of the super page date stored by the parity unit could be generated, and the parity code is stored in the RAM 180. The super page data of the parity unit will not be stored in the RAM 180. It is preferably for the controller 120 to store the parity code of the super page data of the lower page at the RAM 180 and store the super page data of the upper page at the RAM 180. In other embodiment, the XOR gate is not embedded or utilized by the controller 120, the parity code of the super page data of the parity unit is provided by the external device, such as the host 200.

Figure 3:
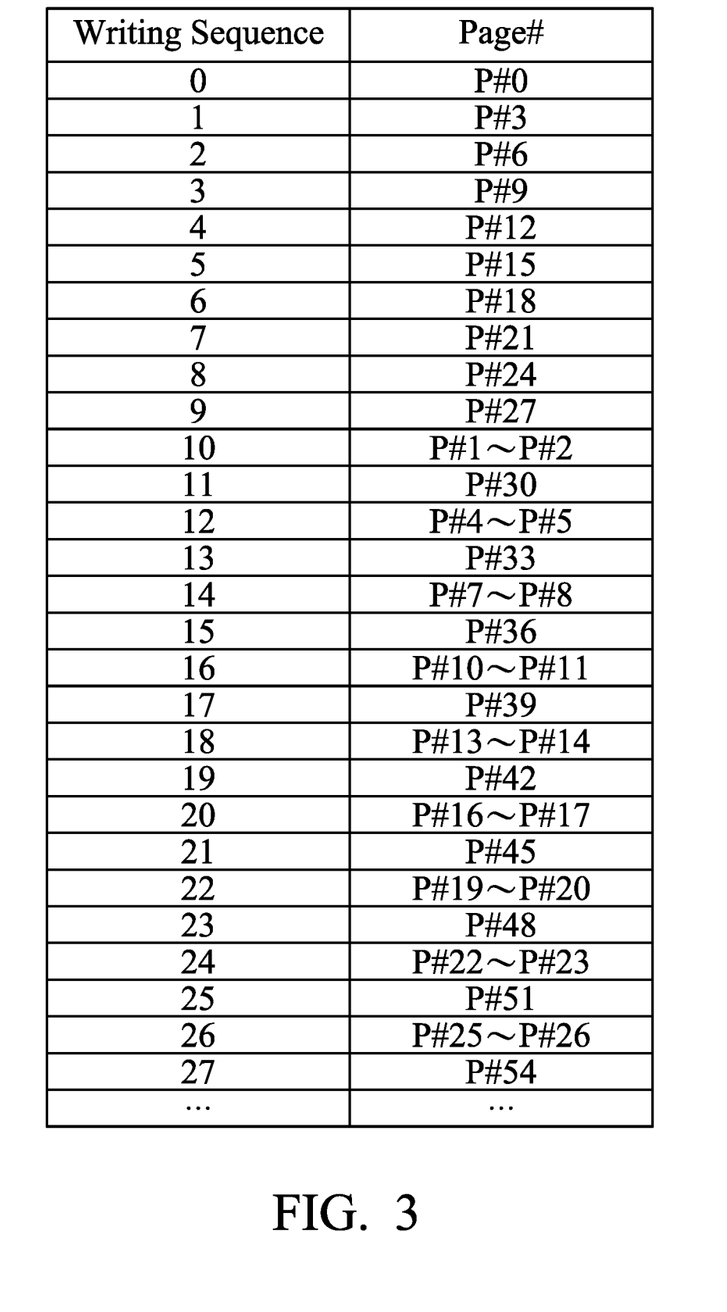
FIG. 3 is a schematic illustrating the write searching table according to an embodiment of the invention.

The parity code is preferably arranged as a Redundant Array of Independent Disks (RAID), such as the arrangement of RAID 5, but it is not limited by the present invention. As shown in FIG. 3, the controller 120 performs the operating on the super page data of the super page SP#0 to generate the parity code PC#0, and stores the parity code PC#0 at the RAM 180, and so on. The RAM 180 merely stores the parity code PC#0 of the page data of the super page SP#0, it does not store the page data of the super page SP#0. Therefore, about three-fourths of the storage space of the RAM 180 could be saved. In other embodiments, the parity code PC#0 is stored on the flash memory 140.

Figure 4:
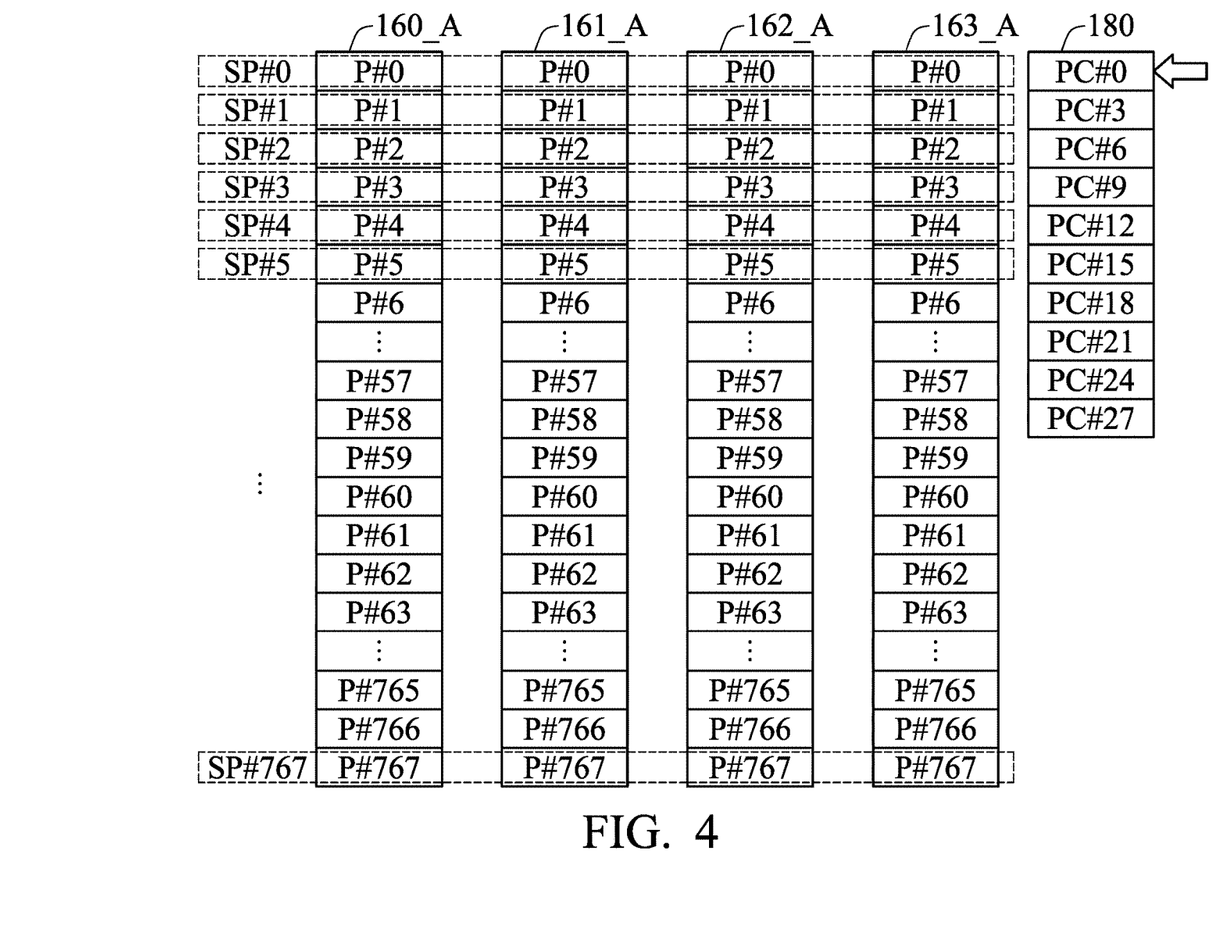
FIG. 4 is a schematic illustrating the spare block and the parity code according to an embodiment of the invention.

In the embodiment of FIG. 4, the flash memory 140 is TLC, the parity unit is a super page, and a super page includes four pages to store a super page data. The two-pass writing operation is performed to write super page data respectively to the lower page and the upper page. The writing difference value is 10. Based on the write searching table or the determination formula, the controller 120 writes a super page data into the super pages SP#0, SP#3, SP#6, SP#9, SP#12, SP#15, SP#18, SP#21, SP#24 and SP#27 (lower page) respectively, stores the parity code PC#0, PC#3, PC#6, PC#9, PC#12, PC#15, PC#18, PC#21, PC#24 and PC#27 of the super page data to the RAM 180. Afterwards, two super page data are written to the super pages SP#1~SP#2 (upper page), and so on.

Because the writing difference value is 10, 10 parity codes are stored in the RAM 180. The indicator is utilized by the controller 120 to indicate the address of the RAM in order to store the parity code or utilize the indicated parity code for recovering data. For example, when the super page data is written to the upper page, the indicator is utilized by the controller 120 to indicate the address of one of the parity codes again in order to obtain the parity code needed for data recovery. For example, when a super page data is written to the super page SP#0 by the controller 120, the address #0 of the RAM 180 is indicated to store the parity code PC#0. When a super page data is written to the super page SP#3 by the controller 120, the address #1 of the RAM 180 is indicated to store the parity code PC#3. When two super page data are written to the super page SP#1~SP#2 by the controller 120, the address #0 of the RAM 180 is indicated to store the parity code PC#0, and so on.

When two super page data are written to the super page SP#1~SP#2 by the controller 120, writing failure occurs on the pages P#1~2 of the block 160_A, which results in the damage or loss for the page data of the page P#0 of the block 160_A of the super page SP#0. As such, the controller 120 reads four page data of the page P#0 of the blocks 160_A, 161_A, 162_A and 163_A. Because the address #0 of the RAM 180 is indicated by the indicator, the parity code PC#0 store at the RAM 180 could be obtained by the controller 120. After the controller 120 calculates the parity code PC#0 and four page data of the page P#0 of the blocks 160_A, 161_A, 162_A and 163_A, it could obtain the page data of the page P#0 of the block 160_A which is the recovered page data of the page P#0 of the block 160_A. Afterwards, the error management procedure is initiated by the controller 120 to re-write the data of the page P#0 of the block 160_A, or write the super page data of the super page SP#0 to another super page such as the super page SP#30, or close the super block to write the super page data of the super page SP#0 to the super page SP#0 of another super block. The re-writing of data is performed for two super page data which should be written to the super pages SP#1~SP#2, or two super page data of the super pages SP#1~SP#2 are written to other super pages such as the super page SP#30 (lower page) and the super page SP#4 (upper page), or the super block is closed so that two super page data of the super pages SP#1~SP#2 could be written into the super pages SP#0 and SP#3 of another super block. Furthermore, the controller 120 could merely read the parity code PC#0 and three page data of the page P#0 of the blocks 161_A, 162_A and 163_A to recover the page data of the page of the block 160_A.

Accordingly, when a page data is damaged at the super page, the damaged page data could be recovered by reading other page data of the super page and the parity code pointed by the indicator for the purpose of data recovery.

In addition, the indicator could be a counting value which is equaled to the writing difference value. When the writing of the super page data (lower page) is completed, the counting value is incremented by 1. When the counting value is accumulated to 10, it will be reset to 0. The address of the required parity code could be obtained by the controller 120 by referring the initial address of the parity code at the RAM 180, the size of the parity code and the counting value. By utilizing the indicator or counting method of the present invention, the controller 120 could obtain the address to store the parity code or the address to obtain the parity code for data recovery.

Figure 5:
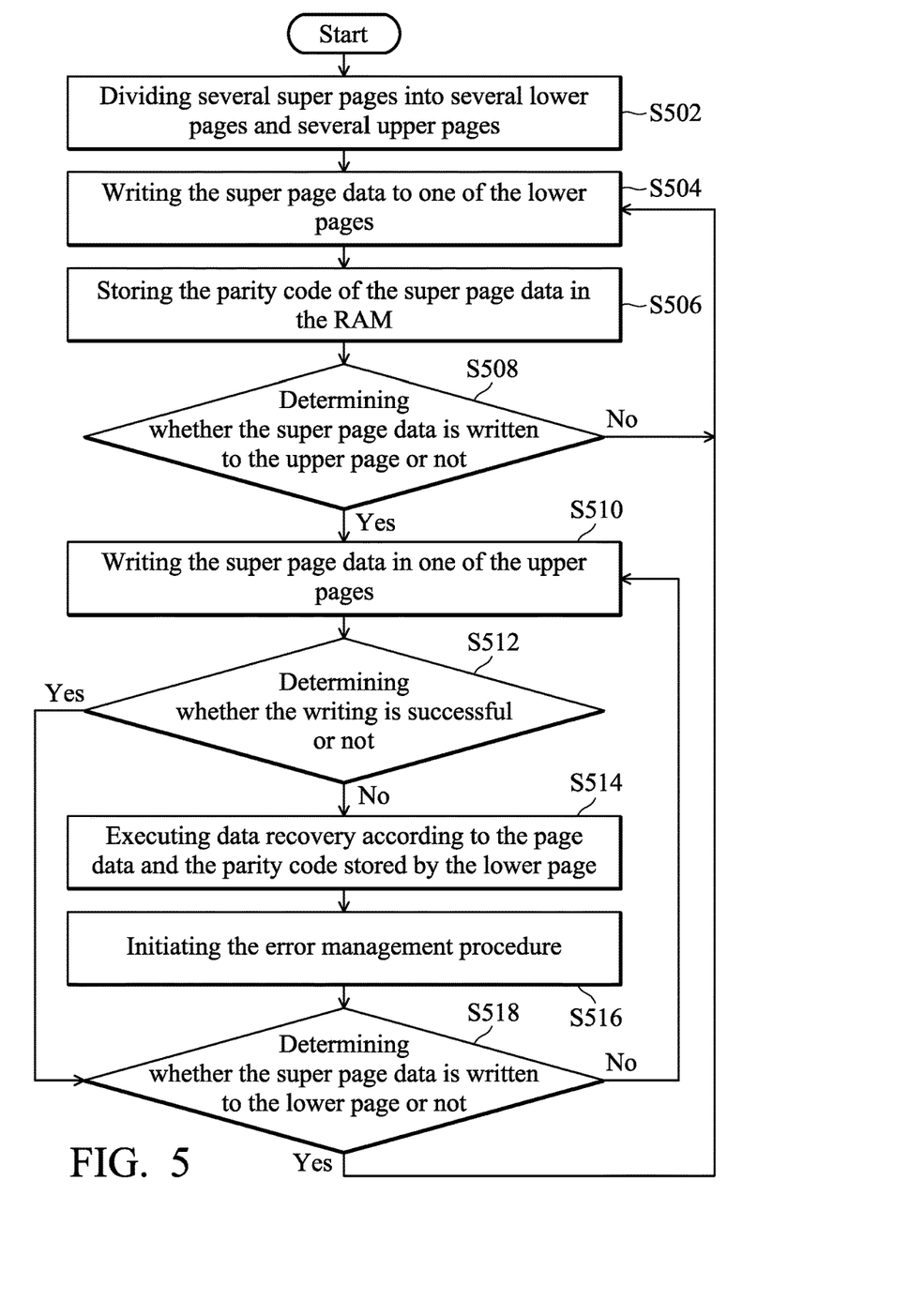
FIG. 5 is a schematic illustrating a data storage method according to an embodiment of the invention.

FIG. 5 is a schematic illustrating a data storage method according to an embodiment of the invention. Step S502: the controller 120 divides several super pages into several lower pages and several upper pages. The super pages are arranged on the super block. The super page is constituted by one or several pages. The lower page and the upper page are controller by the same word line of the block (the super block). The number of the page data stored by the lower page is smaller than or equal to the number of the page data stored by the upper page.

Step S504: The controller 120 writes the super page data to one of the lower pages. The controller 120 determines the super page (the lower page) for the writing of the super page data based on the searching table or the determination formula. For example, the writing sequence is the super pages SP#0, SP#3, SP#6, SP#9, SP#12, SP#15, SP#18, SP#21, SP#24 and SP#27.

Step S506: The controller 120 stores the parity code of the super page data in the RAM 180. The controller 120 stores the parity code PC#0 of the super page data of the super page SP#0 to the address of the RAM 180 which is pointed by the indicator, such as the address #0.

Step S508: The controller 120 determines whether the super page data is written to the upper page or not. The controller 120 determines whether the data is written in the upper page or not based on the searching table or the determination formula. For example, after the super page data is written to the super page SP#27, the super page data will be written to the super pages SP#1-SP#2.

Step S510: The controller 120 determines one of the upper pages for the writing of the super page data. The controller 120 determines the upper page for the writing of the page data based on the searching table or the determination formula. For example, two super page data should be written to the super pages SP#1~2.

Step S512: The controller 120 determines whether the writing is successful or not. If yes, step S518 will be executed. If not, step S514 will be executed.

Step S514: The controller 120 executes data recovery according to the page data and the parity code stored by the lower page. If there is a writing failure in pages P#1~P#2 of the block 160_A when the controller 120 writes two super page data to the super pages SP#1~SP#2, the page data for the page P#0 of the block 160_A of the super page SP#0 will be damaged or lost. In this embodiment, the controller 120 reads the four page data of the page P#0 of the blocks 160_A, 161_A, 162_A and 163_A. Because the indicator is pointing the address #0 of the RAM 180, the controller 120 can obtain the parity code PC#0 of the RAM 180. After calculating the parity code PC#0 and four page data of the page P#0 of the blocks 160_A, 161_A, 162_A and 163_A, the controller 120 could obtain the page data of the page P#0 which is the repaired page data of the page P#0 of the block 160_A.

Step S516: The controller 120 initiates the error management procedure. The controller 120 re-writes the data of the page P#0 of the block 160_A, or writes the super page data of the super page SP#0 to another super page such as the super page SP#30, or close the super block to write the super page data of the super page SP#0 to the super page SP#0 of another super block. The re-writing of data is performed for two super page data which should be written to the super pages SP#1~SP#2, or two super page data of the super pages SP#1~SP#2 are written to other super pages such as the super page SP#30 (lower page) and the super page SP#4 (upper page), or the super block is closed so that two super page data of the super pages SP#1~SP#2 could be written into the super pages SP#0 and SP#3 of another super block.

Step S518: The controller 120 determines whether the super page data is written to the lower page or not. The controller 120 determines whether the data is written to the lower page or not based on the searching table or the determination formula. For example, after the super page data is written to the super pages SP#1~SP#2, the super page data will be written to the super page SP#30.

Figure 6:
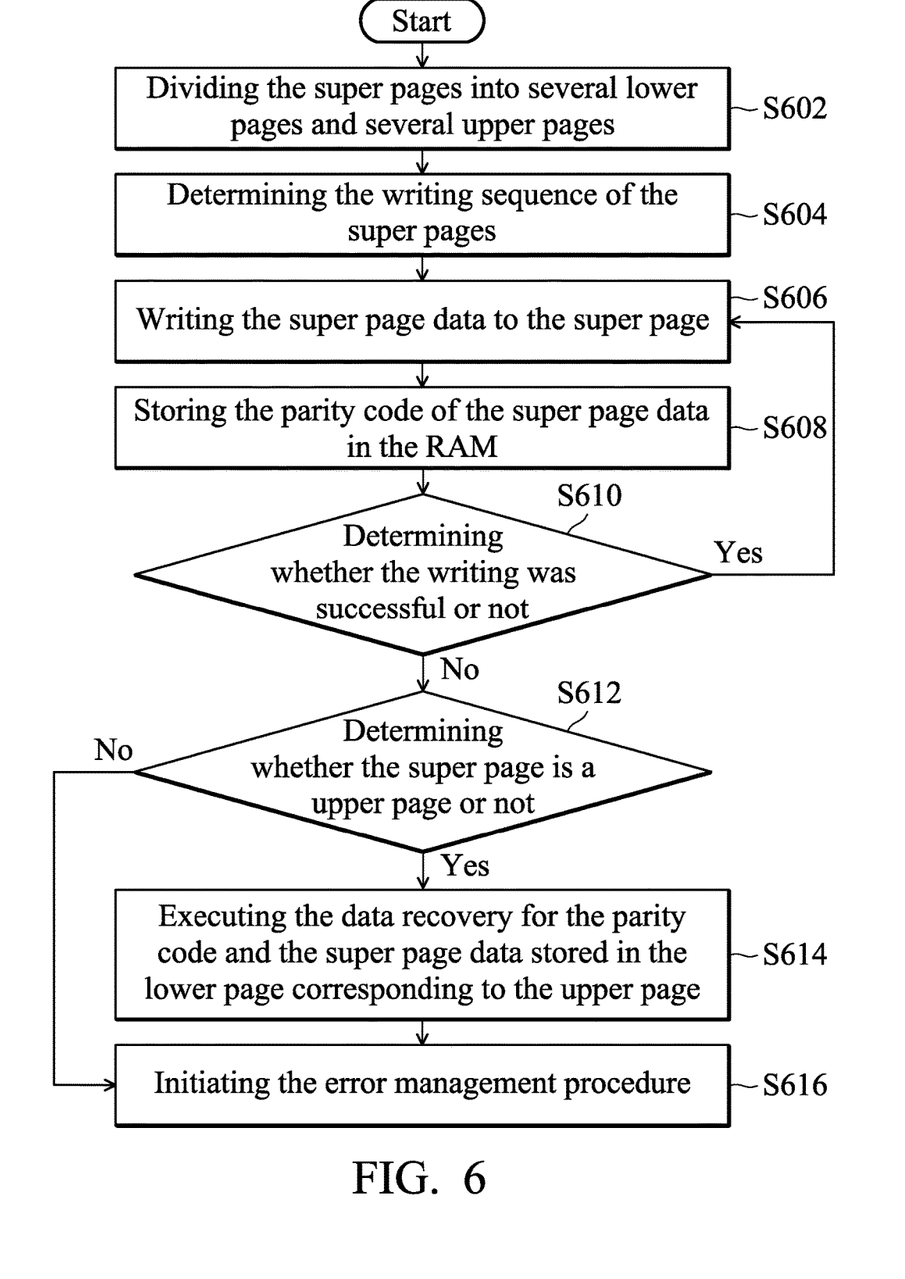
FIG. 6 is a schematic illustrating a data storage method according to another embodiment of the invention.

FIG. 6 is a schematic illustrating a data storage method according to another embodiment of the invention. Step S602: The controller 120 divides the super pages into several lower pages and several upper pages. Step S604: The controller 120 determines the writing sequence of the super pages. Step S606: the controller 120 writes the super page data to the super page. Step S608: The controller 120 stores the parity code of the super page data in the RAM. Step S610: The controller 120 determines whether the writing was successful or not. If yes, step S606 will be executed. If not, step S612 will be executed. Step S612: The controller 120 determines whether the super page is an upper page or not. If yes, step S614 will be executed so that the controller 120 executes the data recovery for the parity code and the super page data stored in the lower page corresponding to the upper page. Afterwards, step S616 will be executed so that the controller 120 initiates the error management procedure. If not, step S616 will be executed. The steps S602~S616 are similar to the steps S502~S518, and will not be repeated again.

Figure 7:
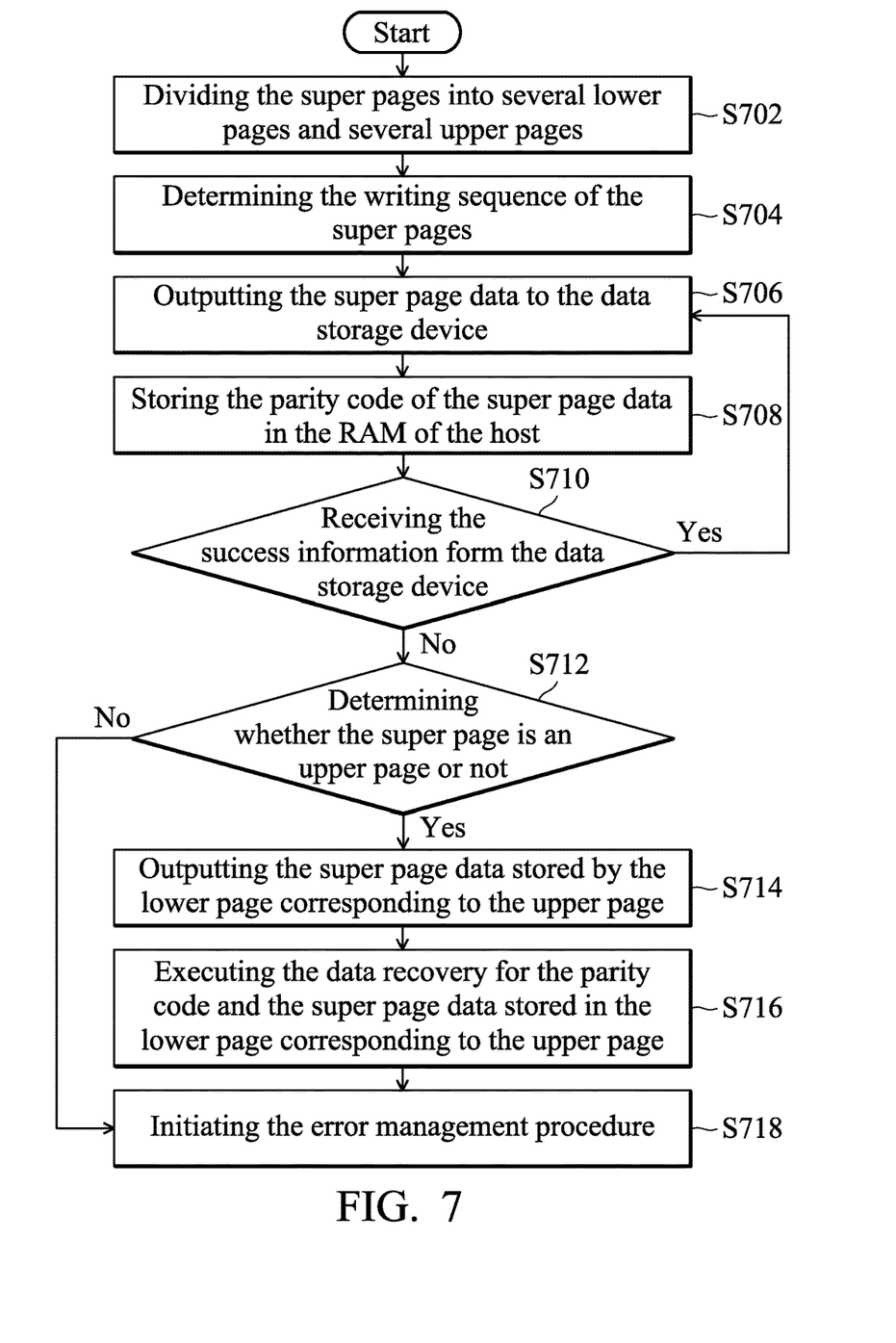
FIG. 7 is a schematic illustrating a data storage method according to another embodiment of the invention.

FIG. 7 is a schematic illustrating a data storage method according to another embodiment of the invention. The process flow of FIG. 7 is similar to the process flow of FIG. 6. The main difference is that the process flow of FIG. 7 is executed by the host 200. The mapping table H2F, the searching table and the determination formula are maintained by the host 200, not by the controller 120. Step S702: The host 200 divides the super pages into several lower pages and several upper pages. Step S704: The controller 120 determines the writing sequence of the super pages. Step S706: the host 200 outputs the super page data to the data storage device 100. Step S708: The host 200 stores the parity code of the super page data in the RAM of the host 200 (not shown). Step S710: The host 200 determines whether the writing is successful or not according to the message which is feedback by the data storage device 100. If yes, step S706 will be executed. If not, step S712 will be executed. Step S712: The host 200 determines whether the super page is an upper page or not. If yes, step S714 will be executed so that the host 200 orders the data storage device 100 to output the super page data stored by the lower page corresponding to the upper page. Step S716: The host 200 executes the data recovery for the parity code and the super page data stored in the lower page corresponding to the upper page. Afterwards, step S718 will be executed so that the host 200 initiates the error management procedure. If not, step S718 will be executed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
 a random access memory (RAM);
 a flash memory, comprising a plurality of blocks, wherein each of the blocks comprises a plurality of pages; and
 a controller, arranging the pages of the blocks to be a plurality of super pages, wherein the super pages are divided into a plurality of first pages and a plurality of second pages, the controller writes a super page data to one of the first pages, generates a parity code based on the super page data and stores the parity code in the RAM, writes another super page data to one of the second pages but does not generate another parity code based on the another super page data.

2. The data storage device as claimed in claim 1, wherein when the super page data is written to the one of the first pages, the controller does not store the super page data in the RAM.

3. The data storage device as claimed in claim 1, wherein when it is required to repair the super page data stored in the one of the first pages, the controller reads the parity code and a part of the super page data and utilizes the parity code and the part of the super page data to repair the super page data.

4. The data storage device as claimed in claim 1, wherein when the another super page data fails to be written to the one of the second pages, the controller repairs the super page data by using the parity code, wherein the one of the second pages and the one of the first pages are controlled by a word line.

5. The data storage device as claimed in claim 1, wherein when the another super page data fails to be written to the one of the second pages, the controller repairs the super page data by using the parity code, wherein the one of the second pages and the one of the first pages are not controlled by a word line.

6. A data storage device, coupled to a host, the data storage device comprising:
 a random access memory (RAM); and
 a flash memory, comprising a plurality of blocks, wherein each of the blocks comprises a plurality of pages, the host arranges the pages of the blocks into a plurality of super pages, wherein the super pages are divided into a plurality of first pages and a plurality of second pages, the host outputs a super page data to the data storage device to write the super page data to one of the first pages, the host generates a parity code based on the super page data and stores the parity code at the RAM, and the host outputs another super page data to the data storage device to write the another super page data to one of the second pages but does not generate another parity code based on the another super page data.

7. The data storage device as claimed in claim 6, wherein when the super page data is written to the one of the first pages, the host does not store the super page data to the RAM.

8. The data storage device as claimed in claim 6, wherein when it is required to repair the super page data stored in the one of the first pages, the host orders the data storage device to output a part of the super page data and utilize the parity code and the part of the super page data to repair the super page data.

9. The data storage device as claimed in claim 6, wherein when the another super page data fails to be written to the one of the second pages, the host repairs the super page data by using the parity code, wherein the one of the second pages and the one of the first pages are controller by a word line.

10. The data storage device as claimed in claim 6, wherein when the another super page data fails to be written to the one of the second pages, the host repairs the super page data by using the parity code, wherein the one of the second pages and the one of the first pages are not controlled by a word line.

11. A data storage method applied to a data storage device which comprises a flash memory and a controller, wherein the flash memory comprises a plurality of blocks, each of the blocks comprises a plurality of pages, and the data storage method comprises:
 arranging the pages of the blocks to be a plurality of super pages, wherein the super pages are divided into a plurality of first pages and a plurality of second pages;
 writing a super page data to one of the first pages;
 generating a parity code based on the super page data;
 storing the parity code in the RAM; and
 writing another super page data to one of the second pages but not generating another parity code based on the another super page data.

12. The data storage method as claimed in claim 11, wherein when the super page data is written to the one of the first pages, the super page data is not stored in the RAM.

13. The data storage method as claimed in claim 11, wherein when it is required to repair the super page data stored in the one of the first pages, reading the parity code and a part of the super page data, and utilizing the parity code and the part of the super page data to repair the super page data.

14. The data storage method as claimed in claim 11, wherein when the another super page data fails to be written to the one of the second pages, repairing the super page data by using the parity code, wherein the one of the second pages and the one of the first pages are controller by a word line.

15. The data storage method as claimed in claim 11, wherein when the another super page data fails to be written to the one of the second pages, repairing the super page data by using the parity code, wherein the one of the second pages and the one of the first pages are not controlled by a word line.

16. The data storage method as claimed in claim 11, further comprising:
 utilizing an indicator to point to the parity code.

17. A data storage method for controlling data storage for a data storage device, wherein the data storage device comprises a flash memory, the flash memory comprises a plurality of blocks, each of the blocks comprises a plurality of pages, and the data storage method comprises:
 arranging the pages of the blocks to be a plurality of super pages, wherein the super pages are divided into a plurality of first pages and a plurality of second pages;
 outputting a super page data to one of the first pages;
 generating a parity code based on the super page data;
 storing the parity code in the RAM; and
 outputting another super page data to one of the second pages but not generating another parity code based on the another super page data.

18. The data storage method as claimed in claim 17, wherein when the super page data is written to the one of the first pages, the super page data is not stored in the RAM.

19. The data storage method as claimed in claim 17, wherein when it is required to repair the super page data stored in the one of the first pages, the data storage device is ordered to output a part of the super page data, and the parity code and the part of the super page data are utilized to repair the super page data.

20. The data storage method as claimed in claim 17, wherein when the another super page data fails to be written to the one of the second pages, the super page data is repaired by using the parity code, wherein the one of the second pages and the one of the first pages are controller by a word line.

21. The data storage method as claimed in claim 17, wherein when the another super page data fails to be written to the one of the second pages, the super page data is repaired by using the parity code, wherein the one of the second pages and the one of the first pages are not controlled by a word line.

22. The data storage method as claimed in claim 17, further comprising:

utilizing an indicator to point the parity code.

* * * * *